(12) United States Patent
Moriwaki et al.

(10) Patent No.: US 6,574,089 B1
(45) Date of Patent: Jun. 3, 2003

(54) MONOLITHIC CERAMIC CAPACITOR

(75) Inventors: Nobushige Moriwaki, Izumo (JP);
Yasuhiko Kubota, Izumo (JP);
Kazuhiro Yoshida, Shimane-ken (JP);
Kenichi Watanabe, Shiga-ken (JP);
Shigeki Nishiyama, Izumo (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/464,236

(22) Filed: Dec. 15, 1999

(30) Foreign Application Priority Data

| Dec. 15, 1998 | (JP) | ............................................ 10-355850 |
| Dec. 18, 1998 | (JP) | ............................................ 10-360499 |
| Feb. 8, 1999 | (JP) | ............................................ 11-029719 |

(51) Int. Cl.[7] ............................................... H01G 2/06
(52) U.S. Cl. ............................... 361/306.3; 361/308.1; 361/309; 361/312
(58) Field of Search ................ 361/301.4, 306.1–306.3, 361/308.1–308.3, 309–313, 320, 321.1–321.5

(56) References Cited

U.S. PATENT DOCUMENTS

| 4,320,281 A | * | 3/1982 | Cruickshank et al. | ........ 219/121 |
| 4,777,558 A | * | 10/1988 | Endo | ........................... 361/306 |
| 5,162,973 A | * | 11/1992 | Miyashita et al. | ........... 361/308 |
| 6,191,933 B1 | * | 2/2001 | Ishigaki et al. | ............. 361/309 |

FOREIGN PATENT DOCUMENTS

| JP | 5322738 | 6/1978 |
| JP | 6240818 | 3/1987 |
| JP | 4-97304 | 8/1992 |
| JP | 5-43503 | 6/1993 |
| JP | 722274 | 1/1995 |

OTHER PUBLICATIONS

Patent Abstracts of Japan, vol. 1995, No. 4, May 31, 1995 for JP 7–22274, abstract. European Search Report dated Jun. 6, 2000.

Japanese Examination Report dated Jul. 9, 2002, along with an English translation.

Utility Model Application No. 55–034860 (Unexamined Utility Model Application Publication No. 56–137437). No date.

* cited by examiner

*Primary Examiner*—Dean A. Reichard
*Assistant Examiner*—Eric W. Thomas
(74) *Attorney, Agent, or Firm*—Ostrolenk, Faber, Gerb & Soffen, LLP

(57) ABSTRACT

In a terminal member, a protuberance is formed so as to protrude toward an external electrode, and thereby, a bonding portion where the terminal member is bonded to the external electrode, the bonding portion being formed with solder, is extended substantially linearly across a part of the external electrode. Preferably, the direction in which the bonding portion is elongated linearly is in parallel to that in which internal electrodes are extended. Further, it is preferable that the bonding portion is as wide as possible, and the center of the bonding portion in the width direction is as near to the center of the end-face of the capacitor body as possible.

19 Claims, 13 Drawing Sheets

US 6,574,089 B1

MONOLITHIC CERAMIC CAPACITOR

BACKGROUND OF THE INVENTION

1. Field of the Invention

The present invention relates to a monolithic ceramic capacitor, and more particularly to a monolithic ceramic capacitor having a structure in which terminal members each comprising a metal plate are bonded to external electrodes.

2. Description of the Related Art

In general, monolithic ceramic capacitors have a rectangular shape, and are provided with external electrodes at the opposite ends thereof, respectively. Ordinarily, when such a monolithic ceramic capacitor is mounted onto an appropriate wiring substrate, the above-mentioned external electrodes are soldered directly to a predetermined conduction land on the wiring substrate whereby the monolithic ceramic capacitor is surface-mounted.

However, when the mounting is carried out by soldering the external electrodes directly onto the wiring substrate as described above, mechanical damage may be caused in the monolithic ceramic capacitor. That is, the capacitor body may be cracked or the external electrodes may be peeled from the capacitor body.

In many cases, such mechanical damage is caused, e.g., by a stress based on shrinkage occurring when solder for connection is solidified, or by a stress produced by a difference between the thermal expansion coefficients of the wiring substrate and the monolithic ceramic capacitor, or by a stress produced by the deflection of the wiring substrate.

These problems have been practically solved by a monolithic ceramic capacitor having external electrodes to which terminal members each comprising a metal plate are attached. In monolithic ceramic capacitors having such a structure, advantageously, a stress which causes the above-described mechanical damage can be mostly absorbed in the metal plates constituting the terminal members, which are distorted in response to the deflection. Accordingly, there is hardly any mechanical damage to the monolithic ceramic capacitors.

Ordinarily, the above-described terminal members are bonded to the external electrodes with a conductive bonding material, for example, solder, with specific faces of the terminal members being opposed to the external electrodes.

However, a monolithic ceramic capacitor having the terminal members bonded thereto as described above may encounter the following new problems.

In particular, when a monolithic ceramic capacitor containing barium titanate type ceramic as a dielectric is used in a high voltage or high frequency range, electrostriction tends to be generated, which is caused by piezoelectric phenomena in the dielectric in the capacitor body. A stress caused by such electrostriction is especially great in high capacitance monolithic ceramic capacitors.

When electrostriction occurs as described above, the displacement of the capacitor body caused by the electrostriction is considerably constrained by the terminal members which are bonded to the external electrodes, with the faces of the terminal members being opposed to the faces of the external electrodes. Therefore, the stress produced by the electrostriction can hardly escape.

As a result, the stress caused by the electrostriction is applied repeatedly and is concentrated on the bonding portions between the terminal members and the external electrodes. Fatigue breaking may occur in the bonding portions. In the worst case, cracks may be formed in the dielectric ceramic portion of the capacitor body. Even if such breaking or the like does not occur, the electrostriction can be transmitted to a wiring substrate or the like, resulting in resonance, which causes a phenomenon called "creaking" in some cases.

SUMMARY OF THE INVENTION

The present invention, however, can provide a monolithic ceramic capacitor which can solve the above-described problems.

To solve the above-described technical problems, according to the present invention, there is provided a monolithic ceramic capacitor which comprises a chip capacitor body having external electrodes formed on the opposite end faces thereof, and plural internal electrodes formed in lamination so that each is electrically connected to a predetermined one of the external electrodes, and terminal members each formed of a metal plate bonded to a respective one of the external electrodes with a conductive bonding material. Each terminal member has a protuberance which projects toward the external electrode so that the bonding portion where the terminal member is bonded to the external electrode extends substantially linearly along a part of the external electrode.

According to the present invention, preferably, the direction in which the bonding portion is elongated substantially linearly is selected to be substantially parallel to the internal electrodes.

In the preferable form described above, the width of the bonding portion is preferably up to $2/3$, more preferably up to $4/9$, and most preferably up to $1/3$ of the size of the end face of the capacitor body, the size being measured in the lamination direction of the internal electrodes.

Further, in the above-described preferred forms, preferably, the center in the width direction of the bonding portion is positioned in the range of $1/5$ to $4/5$, more preferably $2/8$ to $6/8$, and still more preferably $3/8$ to $5/8$ of the size of the end face from one side edge of the end face of the capacitor body in the lamination direction of the internal electrodes, the size being measured in the lamination direction of the internal electrodes.

According to the present invention, in a specific form, the protuberance is formed so as to be elongated continuously linearly. In this case, the protuberance may be formed by a bending line of a metal plate constituting the terminal member.

In another specific form of the present invention, the protuberance may be formed of plural protuberances which are distributed substantially linearly.

Further, the present invention may be applied to a monolithic ceramic capacitor provided with plural capacitor bodies. In this case, the terminal members are attached to the respective external electrodes of the plural capacitor bodies in common.

Moreover, the monolithic ceramic capacitor of the present invention may be provided with a case for accommodating the capacitor body while the terminal elements partially project outside. In the above instance, preferably, positioning pieces for positioning the capacitor body in the case are integrally formed in the terminal members.

Further, according to the present invention, there is provided a monolithic ceramic capacitor which comprises a chip capacitor body having external electrodes formed on the opposite end faces thereof, and plural internal electrodes formed in lamination so that each is electrically connected to a predetermined one of the external electrodes, respectively, and terminal members formed of a metal plate bonded to a respective one of the external electrodes, each terminal member having plural terminal elements arranged so as to be distributed at intervals in the width direction of the external electrode, the plural terminal elements being so constructed that each terminal element positioned at the ends in the arrangement direction has a lower constraining degree being defined as a degree of constraint of a stress produced by the electrostriction phenomenon in of the capacitor body, which is attributed to the bonding of the terminal elements to the external electrodes.

Further, the present invention has been devised based on the knowledge that the ratio of the displacement of a capacitor body occurring when electrostriction in an area mode is generated in a monolithic ceramic capacitor is zero at the center in the width direction of an external electrode, and becomes larger at a position more distant from the center. As described above, the present invention aims at reducing effects of a stress caused by electrostriction by dividing each terminal member into plural terminal elements, and constructing the plural terminal elements so that each terminal element positioned at an end in the arrangement direction, where a high displacement ratio is caused by the electrostriction, has a lower constraining-degree than the terminal elements positioned in the center where a low or zero displacement ratio is presented by the electrostriction, the constraining-degree being defined as a degree of constraint of a stress produced by the electrostriction phenomenon in the capacitor body, which is attributed to the bonding of the terminal elements to the external electrodes.

According to the present invention, to realize the above-described means for solving the problems, typically, in the plural terminal elements, the bonding areas of the terminal elements positioned at the ends in the width direction bonded to the external electrode are smaller than those of the terminal elements positioned in the center. In the above-described typical embodiment, in the plural terminal elements, the terminal elements positioned at the ends in the arrangement direction have a smaller size in the width direction thereof than the terminal elements positioned in the center.

Instead of this or in addition to this, the intervals between the terminal elements positioned at the ends in the arrangement direction and the next terminal elements may be longer than the intervals between the terminal elements positioned in the center and the next terminal elements.

According to the present invention, in a specific form, the plural terminal elements have the form that they are independent of each other. In another specific form, the terminal members each have plural terminal elements formed in a comb-teeth shape.

Moreover, in the monolithic ceramic capacitor of the present invention, preferably, the plural terminal elements formed in a comb-teeth shape are partially bent.

Also, the present invention may be applied to a monolithic ceramic capacitor provided with plural capacitor bodies.

The monolithic ceramic capacitor according to the present invention may be further provided with a case for accommodating a capacitor body while a part of each terminal member is exposed outside.

In the above instance, preferably, in the terminal members, a positioning piece for positioning the capacitor body in the case is formed integrally with at least one of the terminal elements.

Other features and advantages of the present invention will become apparent from the following description of the embodiment of the invention which refers to the accompanying drawings.

DESCRIPTION OF PREFERRED EMBODIMENTS OF THE INVENTION

Figure 1:
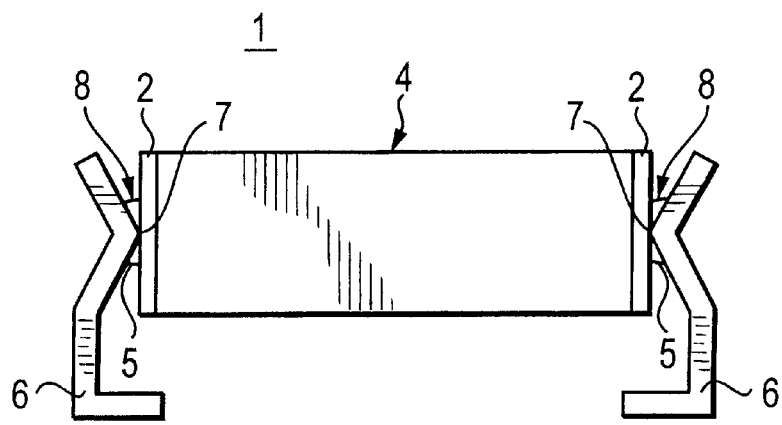
FIG. 1 is a front view showing a monolithic ceramic capacitor 1 according to a first embodiment of the present invention.
Figure 2:
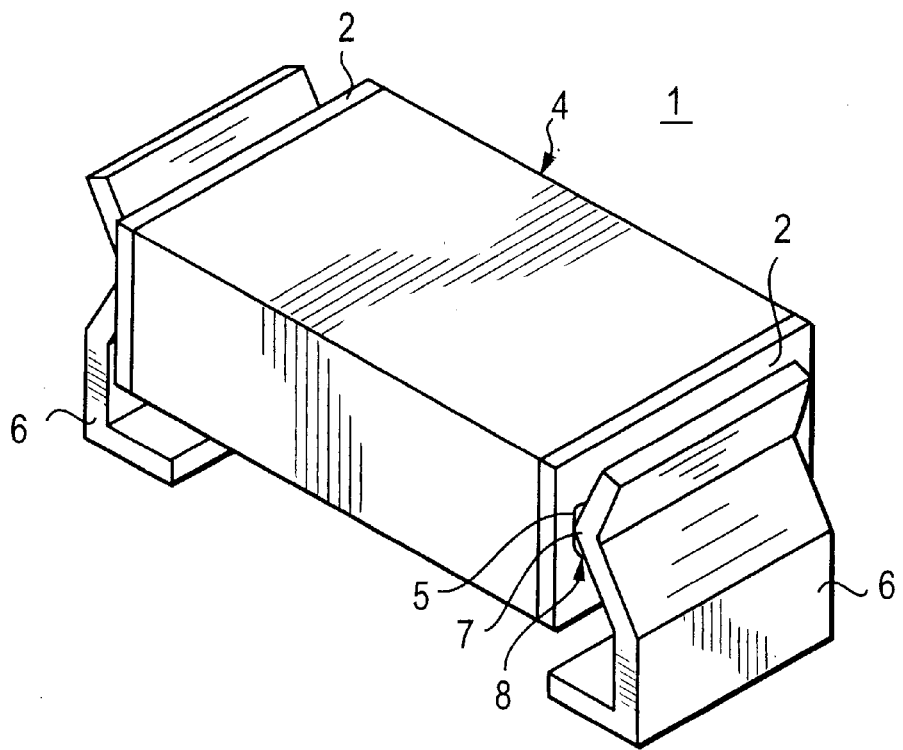
FIG. 2 is a perspective view of the monolithic ceramic capacitor 1 of FIG. 1.

FIGS. 1 and 2 illustrate a monolithic ceramic capacitor according to a first embodiment of the present invention. FIG. 1 is a front view, and FIG. 2 is a perspective view.

The monolithic ceramic capacitor 1 contains a dielectric such as barium titanate type ceramic, and at the opposite end faces, external electrodes 2 are formed, respectively. The monolithic ceramic capacitor 1 is provided with a chip capacitor body 4 in which plural internal electrodes 3 (see FIG. 3) are formed in lamination so that each one is electrically connected to a predetermined one of the external electrodes 2, and is further provided with terminal members 6 each formed of a metal plate bonded to the external electrodes 2 by use of solder 5 as a conductive bonding material.

In such a monolithic ceramic capacitor 1, in this embodiment, characteristically, each terminal member 6 has a protuberance 7 formed so as to project toward the external electrode 2, and the bonding portion 8 of the terminal member 6 bonded to the external electrode 2 by use of the solder 5 is formed so as to be elongated substantially linearly across a part of the external electrode 2.

In particular, each bonding portion 8 as described above is elongated substantially linearly in parallel to the direction in which the internal electrodes 3 (FIG. 3) are extended. The protuberance 7 for forming the bonding portion 8 which is elongated substantially linearly is also formed so as to be elongated continuously linearly. More concretely, the protuberance 7 is formed of a bending line provided in the metal plate constituting the terminal member 6. The bonding portion 8 is provided, for example, by forming a solder film on the external electrode 2 previously, and melting the solder film while the terminal member 6 is in contact with the solder film, whereby the bonding portion 8 is formed so as to have a fillet generated by the shrinkage of the solder caused by the surface tension. Further, the bonding portion 8 does not go all the way across the external electrode 2. That is, the size of the bonding portion 8 in the longitudinal direction (the size in the direction perpendicular to the plane of FIG. 1) is shorter than the size of the end-face of the capacitor body 4 in the same direction (the size in the direction perpendicular to the plane of FIG. 1). This is one of measures which relax as much as possible the thermal shock that is generated during soldering with solder 5.

Figure 3:
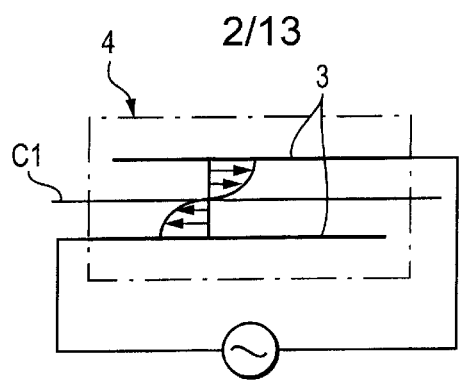
FIG. 3 is an enlarged sectional view illustrating a displacement distribution caused by electrostriction between a pair of internal electrodes 3 inside the capacitor body 4 of FIG. 1.
Figure 4:
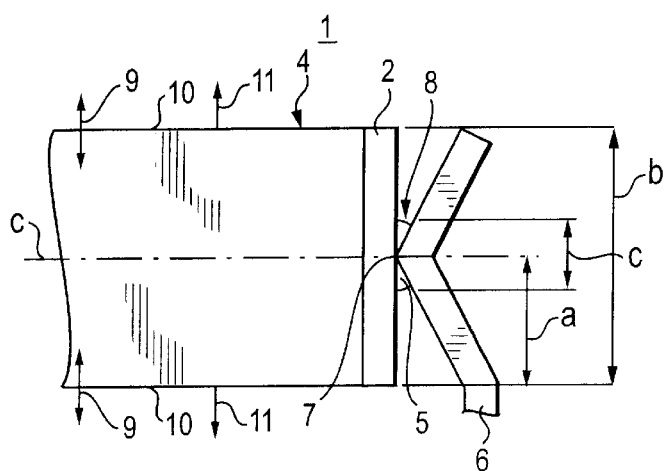
FIG. 4 is a partially enlarged front view of the monolithic ceramic capacitor 1 of FIG. 1, illustrating an electrostriction mode and the emission state of energy produced by the electrostriction.

FIG. 3 illustrates the displacement distribution between a pair of internal electrodes 3 which is caused by electrostriction. FIG. 4 is an enlarged view of part of the monolithic ceramic capacitor 1 of FIG. 1.

As seen in FIG. 3, the displacement caused by the electrostriction increases with distance from the center line C1 between a pair of the internal electrodes 3. Therefore, considering the whole of the capacitor body 4 in which plural layers of such internal electrodes 3 are laminated, the displacement most likely to be caused by the electrostriction is displacement in a thickness mode, as indicated by arrow 9 in FIG. 4.

In this embodiment, the bonding portion 8 of the terminal member 6 and the external electrode 2 lies along only a limited part of the external electrode 2, and is elongated substantially linearly in parallel to the direction in which the internal electrodes 3 are extended. Therefore, the displacement in a thickness mode caused by the electrostriction as described above, not constrained substantially by the terminal member 6, is transmitted to both the main faces 10 of the capacitor body 4, and the energy of such displacement is effectively emitted from both the main faces 10 which are free ends of the capacitor body 4, as indicated by arrow 11.

Accordingly, all of the bonding portion 8, the capacitor body 4, and moreover, a wiring substrate (not illustrated) having the terminal member 6 soldered thereto can be substantially prevented from being affected by such a stress caused by the electrostriction as described above.

For the purpose of relaxing a stress caused by electrostriction based on the above-described principle, it is preferable that the protuberance 7 of the terminal member 6 is disposed as near to the center line C in the thickness direction of the capacitor body 4 as possible, as shown in FIG. 4, and the center in the width direction of the bonding portion 8 formed of the solder 5 is positioned as near to the center line C as possible. In relation to this, the distance a between the center in the width direction of the bonding portion 8 and one-side edge of the end-face of the capacitor body 4 in the lamination direction (the thickness direction of the capacitor body 4) of the internal electrodes 3 is in the range of preferably $1/5$ to $4/5$, more preferably $2/8$ to $6/8$, and most preferably $3/8$ to $5/8$ of the size b of the end face of the capacitor body 4, the size b being measured in the lamination direction of the internal electrodes 3.

Similarly, for the purpose of relaxing a stress caused by the electrostriction, it is preferable that the width c of the bonding portion 8 is as short as possible. In relation to this, the width c of the bonding portion 8 is selected to be preferably up to $2/3$, more preferably up to $4/6$, still more preferably up to $1/3$ of the size b of the end-face of the capacitor body 4, the size being measured in the lamination direction of the internal electrodes 3.

FIGS. 5, 6, 7, and 8 are partial front views showing monolithic ceramic capacitors 1a, 1b, 1c, and 1d according to a second, a third, a fourth, and a fifth embodiment of the present invention, respectively. Elements shown in FIGS. 5 through 8 equivalent to those in FIG. 1 are designated by similar reference numerals. Duplicated description is omitted.

Figure 5:
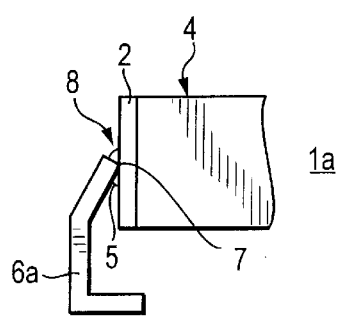
FIG. 5 is a front view partially showing a monolithic ceramic capacitor 1a according to a second embodiment of the present invention.

In a monolithic ceramic capacitor 1a, as shown in FIG. 5, a protuberance 7 is formed by the tip of a bent-portion of a terminal member 6a.

Figure 6:
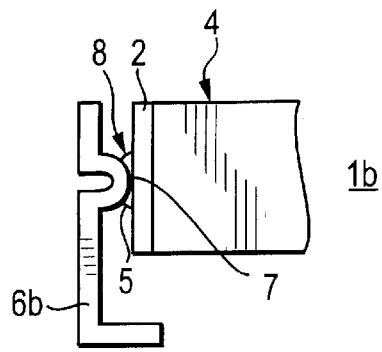
FIG. 6 is a front view partially showing a monolithic ceramic capacitor 1b according to a third embodiment of the present invention.

In a monolithic ceramic capacitor 1b as shown in FIG. 6, a protuberance 7 is formed by a C-shaped bent-portion of a terminal member 6b.

Figure 7:
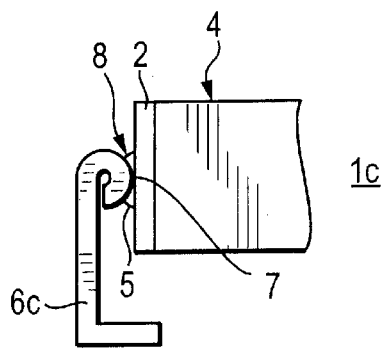
FIG. 7 is a front view partially showing a monolithic ceramic capacitor 1c according to a fourth embodiment of the present invention.

In a monolithic ceramic capacitor 1c as shown in FIG. 7, a protuberance 7 is formed by part of a loop-shaped bent-portion of a terminal member 6c.

Figure 8:
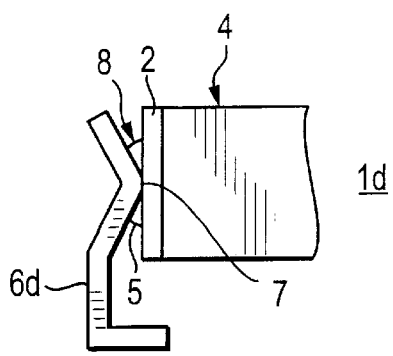
FIG. 8 is a front view partially showing a monolithic ceramic capacitor 1d according to a fifth embodiment of the present invention.

In a monolithic ceramic capacitor 1d as shown in FIG. 8, the protuberance 7 of a terminal member 6d is not so sharp as that in FIG. 1 but has a predetermined width. For example, the area where the protuberance 7 contacts the external electrode 2 may have a length of 5t, where t is the thickness of the protuberance 7.

Figure 9:
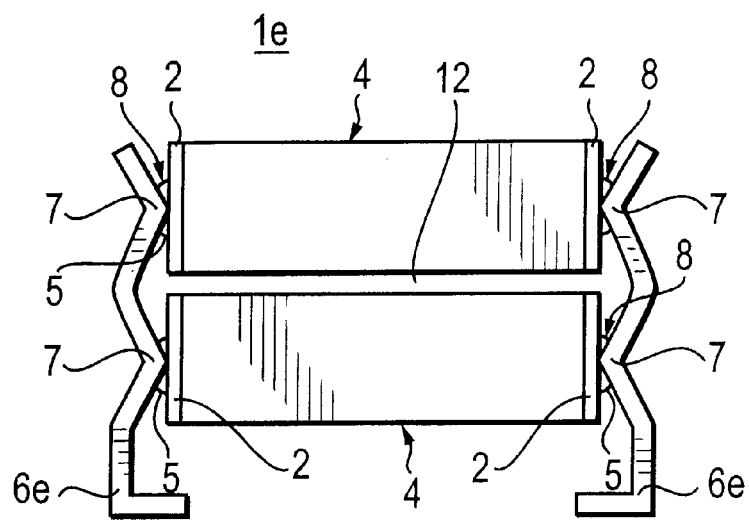
FIG. 9 is a front view of a monolithic ceramic capacitor 1e according to a sixth embodiment of the present invention.
Figure 10:
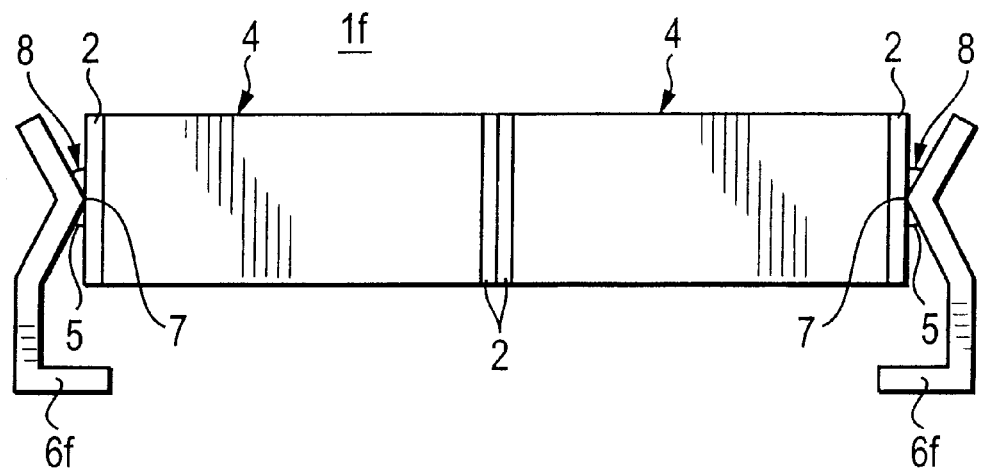
FIG. 10 is a front view of a monolithic ceramic capacitor 1f according to a seventh embodiment of the present invention.
Figure 11:
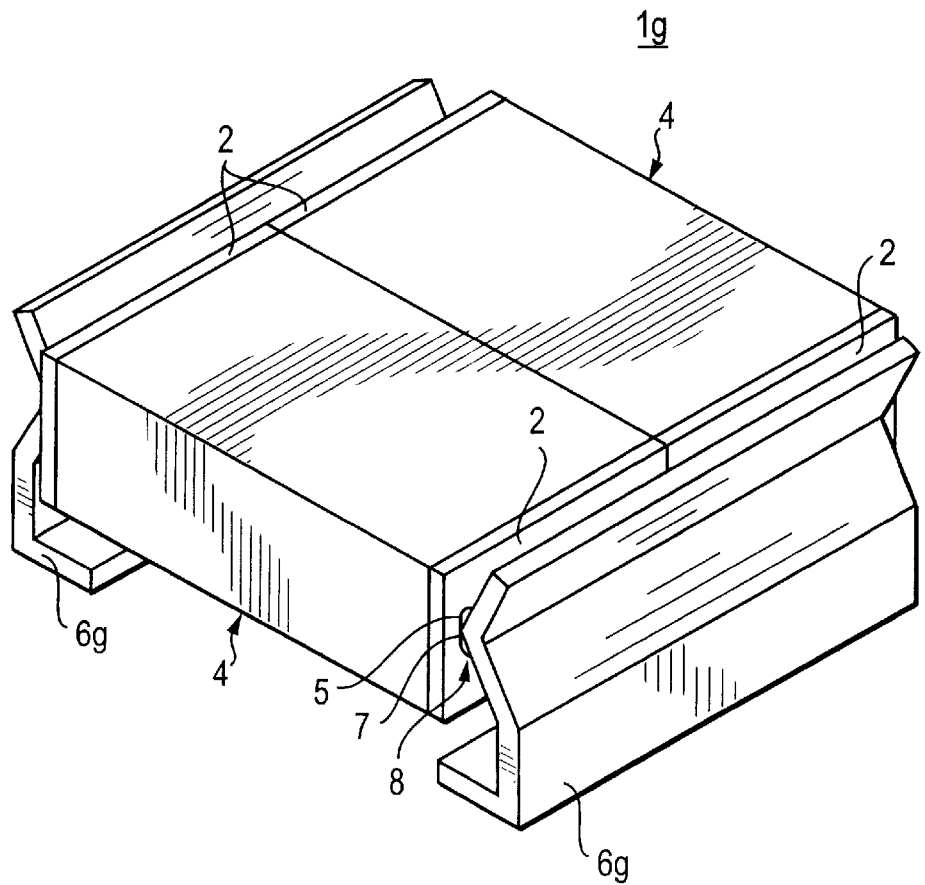
FIG. 11 is a perspective view of a monolithic ceramic capacitor 1g according to an eighth embodiment of the present invention.

FIGS. 9, 10, and 11 illustrate monolithic ceramic capacitors 1e, 1f, and 1g according to a sixth, a seventh, and an eighth embodiment of the present invention, respectively. FIGS. 9 and 10 are front views, and FIG. 11 is a perspective view. Elements shown in FIGS. 9 through 11 equivalent to those in FIG. 1 are designated by similar reference numerals. Duplicated description is omitted.

A monolithic ceramic capacitor 1e as shown in FIG. 9 has a stack component structure in which plural, e.g., two capacitor bodies 4 are stacked and mounted together by terminal members 6e which are attached to the respective external electrodes 2 of the two capacitor bodies 4 in common. With these terminal members 6e, the two capacitor bodies 4 are electrically connected in parallel. The terminal members 6e have protuberances 7 formed correspondingly to the external electrodes 2.

A gap 12 is provided between the two capacitor bodies 4 in order to prevent the electrostriction phenomena occurring in the respective capacitor bodies 4 from interfering with each other. The two capacitor bodies 4 may be bonded to each other by use of an adhesive such as an adhesive with a Shore A hardness of up to 90 which is capable of absorbing the electrostriction phenomenon, instead of the gap 12.

A monolithic ceramic capacitor 1f as shown in FIG. 10 is provided with plural, e.g., two capacitor bodies 4 which are arranged in series so as to lie in a plane. The external electrodes 2 of the respective two capacitor bodies 4 to be connected to each other are bonded by use of a conductive bonding material such as solder or a conductive adhesive. An appropriate terminal member preferably having a protuberance, though not illustrated, may be inserted between the external electrodes 2 and bonded with the conductive bonding material, if necessary.

Terminal members 6f are attached to the external electrodes 2 positioned at opposite ends of the two capacitor bodies 4 electrically connected in series, respectively. The terminal members 6f have substantially the same shape as the terminal members 6 as shown in FIG. 1.

A monolithic ceramic capacitor 1g as shown in FIG. 11 is provided with plural, e.g., two capacitor bodies 4, which are arranged in parallel so as to lie in a plane. These two capacitor bodies 4 are bonded by use of a two-sided pressure-sensitive adhesive tape or an adhesive.

Terminal members 6g each have such a length that the respective external electrodes 2 of the two capacitor bodies 4 can be connected in common.

Figure 12:
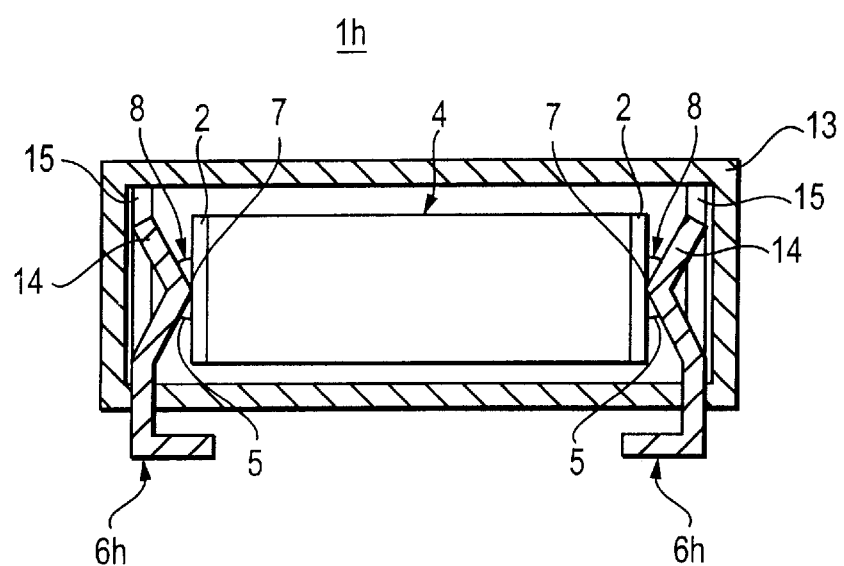
FIG. 12 is a partially sectional front view of a monolithic ceramic capacitor 1h according to a ninth embodiment of the present invention.

FIG. 12 is a front view of a monolithic ceramic capacitor 1h according to a ninth embodiment of the present invention, in which a part of the monolithic ceramic capacitor is illustrated in a cross section. Elements in FIG. 12 equivalent to those in FIG. 1 are designated by similar reference numerals, and the duplicated description is omitted.

Figure 13:
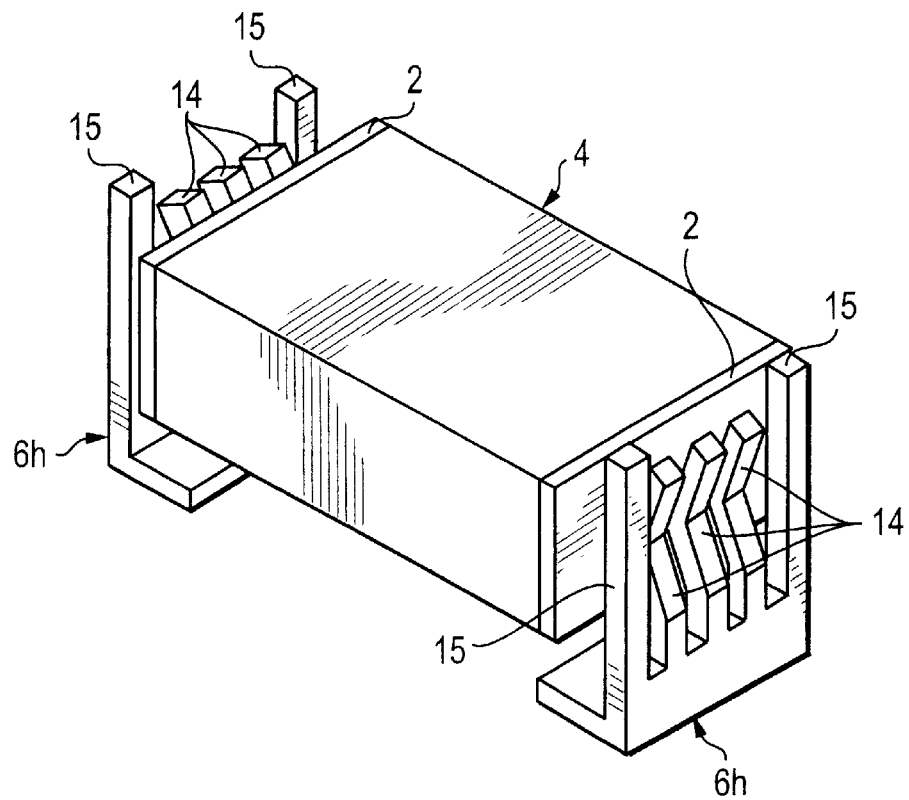
FIG. 13 is a perspective view showing a capacitor body 4 and a terminal members 6h provided for the monolithic ceramic capacitor 1h of FIG. 12.

Characteristically, the monolithic ceramic capacitor 1h of FIG. 12 is provided with a case 13 for accommodating a capacitor body 4 while terminal members 6h partially project outside. In the perspective view of FIG. 13, only the components which are accommodated in the case 13 of the monolithic ceramic capacitor 1h are illustrated.

The terminal members 6h each are provided with plural, e.g., three comb-teeth shape pieces 14. Protuberances 7 are formed in the comb-teeth shape pieces 14, respectively. That is, in this embodiment, the plural protuberances 7 are formed in each terminal member 6h so as to be distributed substantially linearly.

Further, positioning pieces 15 are integrally formed at both sides of the terminal member 6h. The positioning pieces 15 are provided to position the capacitor body 4 in the case 13, as seen most clearly in FIG. 12.

In this embodiment, the capacitor body 4 is covered with the case 13. Therefore, the transmission of impact to the capacitor body 4 produced during mounting can be reduced, and moreover, breaking of the capacitor body 4 caused by collision with external objects can be prevented. In addition, an undesired stress applied to the terminal member 6h can be prevented from being propagated to the bonding portion 8.

Further, in this embodiment, though not illustrated, the space inside the case 13 may be packed with an appropriate resin (potting material). By this means, the inside of the case 13 is shielded from moisture, gases, and so forth, and further improvements in reliability are realizable. When high frequency current is applied to the monolithic ceramic capacitor 1h, heat is generated due to the impedance of the capacitor body 4. However, by employing a potting resin having a high thermal conductivity, the heat radiation efficiency can be enhanced, as compared with the instance where a space remains in the case 13.

Figure 14:
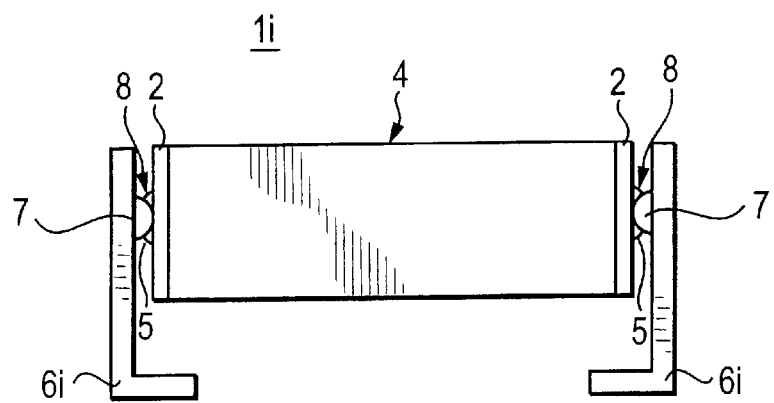
FIG. 14 is a front view of a monolithic ceramic capacitor 1i according to a tenth embodiment of the present invention.

FIG. 14 is a front view of a monolithic ceramic capacitor 1i according to a tenth embodiment of the present invention. Elements in FIG. 14 equivalent to those in FIG. 1 are designated by similar reference numerals, and duplicated description is omitted.

Figure 15:
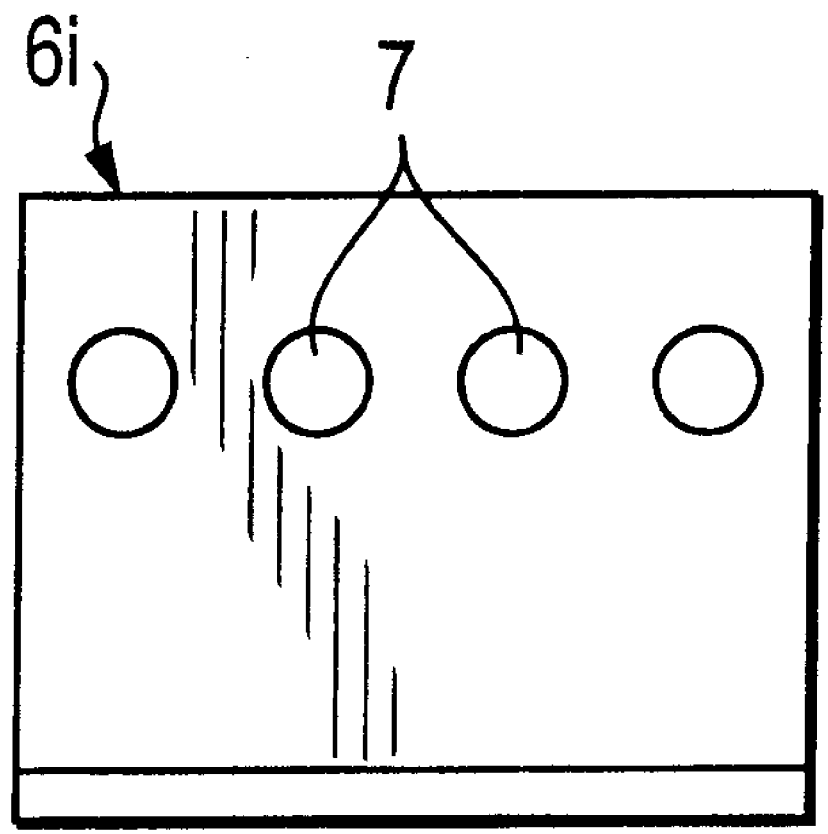
FIG. 15 illustrates the side of the terminal member 6i provided for the monolithic ceramic capacitor 1i of FIG. 14 which faces an external electrode 2.

The monolithic ceramic capacitor 1i as shown in FIG. 14 is provided with terminal members 6i only one of which is shown in FIG. 15. FIG. 15 illustrates the side of the terminal member 6i which faces the external electrode 2. The terminal member 6i is provided with plural protuberances 7 distributed substantially linearly. These protuberances 7 can be formed by deep drawing by means of a press when the terminal member 6i is shaped.

As in the previous embodiments, also in the instance of plural protrusions 7 provided so as to be distributed substantially linearly as in this embodiment, the bonding portion 8 for bonding to an external electrode 2, formed of a solder 5, can be distributed substantially linearly across a part of the external electrode 2.

The present invention has been described in reference to the illustrated several embodiments. In addition, various modifications and variations are possible without departing from the scope of the present invention.

For example, in the above-described embodiments, the solder 5 is used as the conductive bonding material for bonding the terminal members 6 or the like to the external electrodes 2. A conductive adhesive may be employed instead of the solder 5. Moreover, when the solder 5 is employed, the advantages of the present invention become more prominent by using solder having a relatively high hardness such as lead-free solder.

Further, in the above-described embodiments, the bonding portion 8 is formed so as to be elongated linearly along one straight line. However, the bonding portion 8 may be formed so as to be elongated along at least two straight lines or along a curved line.

Moreover, in the above-described embodiments, only the bonding portion 8 is formed with the solder 5. However, solder may be applied to other areas of the terminal members 6 or the like, and the external electrodes 2, in other places besides the bonding portion 8. For example, solder may be coated all over the surface of an external electrode 2 or a terminal member 6.

In addition, an embodiment in which the features of the respective embodiments described above are combined is possible. For example, the structure containing the case 13 as shown in FIG. 12 may be employed in the respective embodiments as shown in FIGS. 1, 5 through 11, and 14. Moreover, in the respective embodiments of FIGS. 9 through 11 containing plural capacitor bodies 4, the shapes of the terminal members as shown in FIG. 5 through 8, 12, and 14 may be employed. Further, the terminal members 6h as shown in FIG. 12 may be applied to a monolithic ceramic capacitor not provided with the case 13.

Figure 16:
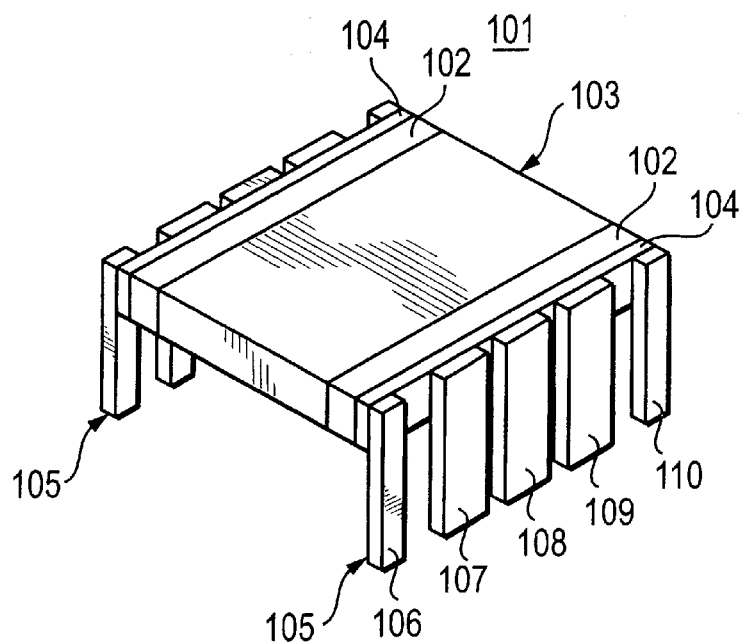
FIG. 16 is a perspective view of a monolithic ceramic capacitor 101 according to an eleventh embodiment of the present invention.

FIG. 16 is a perspective view of a monolithic ceramic capacitor 101 according to an eleventh embodiment of the present invention.

The monolithic ceramic capacitor 101 is provided with external electrodes 102 formed at the opposite end faces thereof, a chip capacitor body 103 in which plural internal electrodes (not illustrated) are formed in lamination so as to be electrically connected to a predetermined one of the external electrodes 102, respectively, and terminal members 105 each formed of a metal plate bonded to the external electrodes 102 by use of solder 104 as a conductive bonding material.

In such a monolithic ceramic capacitor 101, in this embodiment, each terminal member 105 comprises plural, e.g., five terminal elements 106, 107, 108, 109, and 110 arranged so as to be distributed at intervals in the width direction of the external electrode 2. These terminal elements 106 through 110 are so constructed that the terminal elements 106 and 110 positioned at the ends in the arrangement direction have a lower constraining-degree than the terminal element 108 or the terminal elements 107 through 109 positioned in the center, said constraining degree being defined as the degree of constraining a stress produced by the electrostriction phenomenon in the capacitor body 103, which is attributed to the bonding of the terminal elements 106 through 110 to the external electrode 102.

More concretely, in the terminal elements 106 through 110, the terminal elements positioned at the ends in the arrangement direction have a smaller bonding area on the external electrode 102, as compared with the terminal elements positioned in the center. Still more concretely, as compared with the terminal elements 108 or the terminal elements 107 through 109 positioned in the center, the terminal elements 106 and 110 positioned at the ends in the arrangement direction have a smaller size in the width direction, and moreover, the intervals between the terminal elements 106 and 110 and the corresponding next terminal elements 107 and 109 are wider than those between the terminal element 108 at the center and the next terminal elements 107 and 109.

Figure 17:
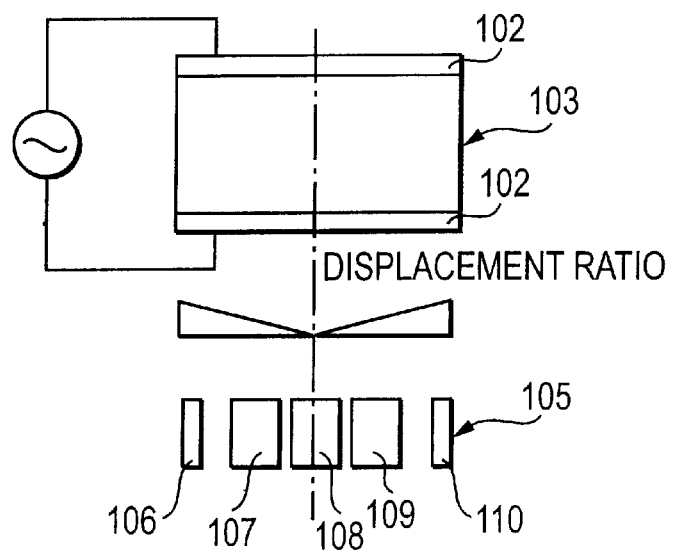
FIG. 17 illustrates the positional relationship between the terminal elements 106 to 110 in the width direction of the external electrode 102, with respect to the capacitor body 103 as shown in FIG. 16, and moreover, a displacement distribution of the capacitor body 103 in the width direction of the external electrode 102, caused by electrostriction.

FIG. 17 shows the position relationship of the terminal elements 106 through 110 to the capacitor body 103 in the width direction of the external electrode 102. In addition, illustrated is the displacement distribution in the width direction of the external electrode 102 of the capacitor body 103 caused by electrostriction.

When the electrostriction in an area mode is generated in the monolithic ceramic capacitor 101, the displacement ratio of the capacitor body 103, observed in the width direction of the external electrode 102, is zero at the center, and becomes larger at a position farther from the center, as shown in FIG. 17.

Accordingly, as described above, referring to the degree of constraining a stress produced by the electrostriction phenomena of the capacitor body 103, which is attributed to the bonding of the plural terminal elements 106 through 110 to the external electrode 102, the terminal elements 106 and 110 positioned at the ends where a high displacement ratio is caused by the electrostriction can be adjusted to have a lower constraining-degree than those of the terminal elements 108 or the terminal elements 107 through 109 positioned in the center where a low displacement ratio is caused by the electrostriction by setting the size in the width direction of the terminal elements 106 and 110 positioned at the ends to be smaller than that of the terminal element 108 or 107 through 109 positioned in the center, and moreover, setting the intervals between the terminal elements 106 and 110 positioned at the ends and the corresponding next terminal elements 107 and 109 to be wider than those between the terminal element 108 positioned at the center and the next terminal elements 107 and 109.

As a result, the effects of stress caused by electrostriction on the bonding portions of the terminal elements 106 through 110 bonded to the external electrodes 102 with solder 104, the capacitor body 103, and a wiring substrate (not illustrated) having the terminal elements 106 through 110 soldered thereto, can be reduced.

Thus, the above-described embodiment, can reduce the degree of constraint of a stress produced by the electrostriction phenomenon in the capacitor body 103, which is attributed to the bonding of the terminal elements 106 through 110 to the external electrode 102. Two means are employed for reducing the constraining-degree of the terminal elements positioned at the ends in the arrangement direction of the plural terminal elements 106 through 110, to be lower than that of the terminal elements positioned in the center; first, changing the sizes in the width direction of the terminal elements 106 through 110, and second, changing the intervals between the terminal elements 106 through 110. Either one or both of these two means may be employed. This will be described below with reference to FIGS. 18 and 19.

Figure 18:
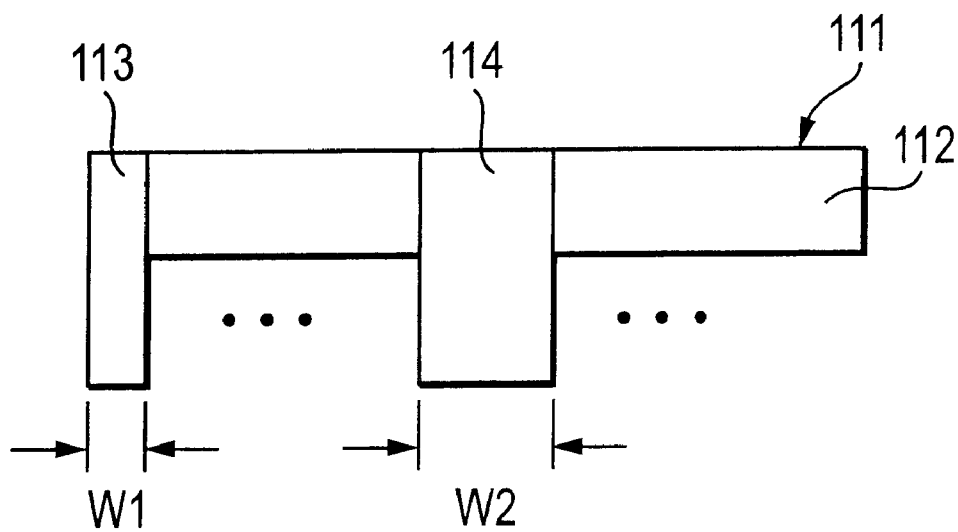
FIG. 18, given to explain changing the sizes in the width direction of plural terminal elements, is a side view showing the positional relationship between an external electrode 112 formed on a capacitor body 111 and terminal elements 113 and 114.

FIG. 18, given to explain changing the sizes in the width direction of the terminal elements, illustrates the positional relationship between the external electrode 112 on the capacitor body 111 and the terminal elements 113 and 114.

Referring to FIG. 18, the size in the width direction of the terminal element 113 positioned at the end is designated by W1, and that of the terminal element 114 positioned at the center by W2. All of the intervals between adjacent terminal elements of the plural terminal elements containing the terminal elements 113 and 114 are assumed to be equal, though not illustrated.

In such a monolithic ceramic capacitor, the ratio of the size W1 in the width direction of the terminal element 113 at the end to the size W2 of the terminal element 114 at the center was varied as listed in the following Table 1, and for each case, the generation ratio of cracks was measured. The crack generation ratio is a ratio at which cracks are generated in the capacitor body 111 when a high frequency current is applied.

TABLE 1

| W1 | CRACK GENERATION RATIO |
|---|---|
| W2 × 1 | 5% |
| W2 × 0.9 | 0.5% |
| W2 × 0.8 | 0% |
| W2 × 0.7 | 0% |
| W2 × 0.6 | 0% |

As seen in Table 1, the crack generation ratio can be reduced by setting the size W1 in the width direction of the terminal element 113 positioned at the end to be smaller than the size W2 in the width direction of the terminal element 114 at the center. For example, the generation of cracks can be reliably prevented by setting the size W1 in the width direction to be smaller than the size W2 in the width direction multiplied by 0.8.

Figure 19:
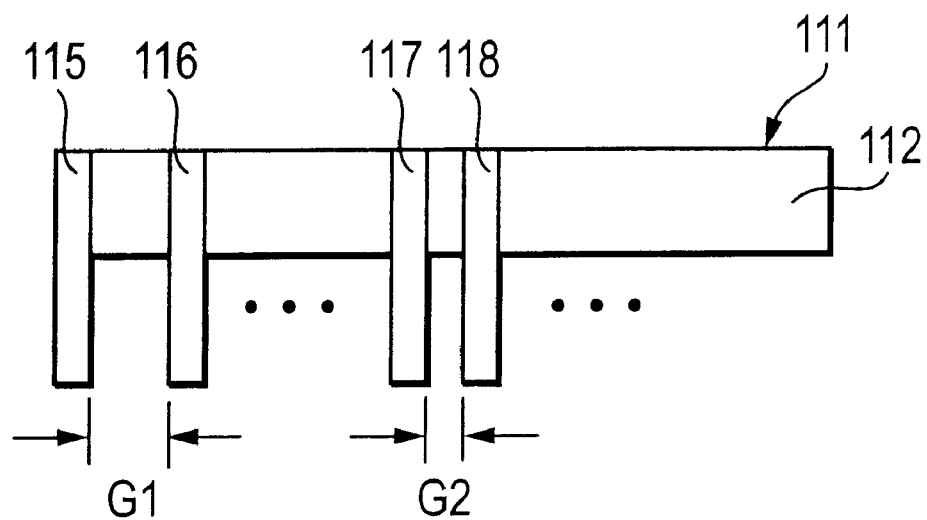
FIG. 19, given to explain changing the intervals between adjacent ones of the plural terminal elements, is a side view showing the positional relationship between terminal elements 115 through 118 and an external electrode 112 on the capacitor body 111.

FIG. 19, given to explain changing the intervals between adjacent ones of the plural terminal elements, is a side view illustrating the positional relationship between the external electrode 112 on the capacitor body 111 and the terminal elements 115 through 118.

Hereupon, shown is the positional relationship of the interval G1 between the terminal element 115 at the end and the next terminal element 116 to the interval G2 between the terminal element 118 at the center and the next terminal element 117. The sizes in the width direction of the terminal elements 115 through 118 are set to be equal.

The following Table 2 lists the crack generation ratios which were obtained when the ratio of the interval G1 between the terminal element 115 at the end and the terminal element 116 to the interval G2 between the terminal element 118 at the center and the terminal element 117 was varied.

TABLE 2

| G1 | CRACK GENERATION RATIO |
|---|---|
| G2 × 1 | 5% |
| G2 × 1.1 | 0.6% |
| G2 × 1.2 | 0% |
| G2 × 1.3 | 0% |
| G2 × 1.4 | 0% |

As seen in Table 2, the crack generation ratio can be reduced by setting the interval G1 between the terminal element 115 positioned at the end and the terminal element 116 to be wider than the interval G2 between the terminal element 117 positioned at the center and the terminal element 118. In particular, the generation of cracks can be reliably prevented by setting the interval G1 to be more than the interval G2 multiplied by 1.2.

Figure 20:
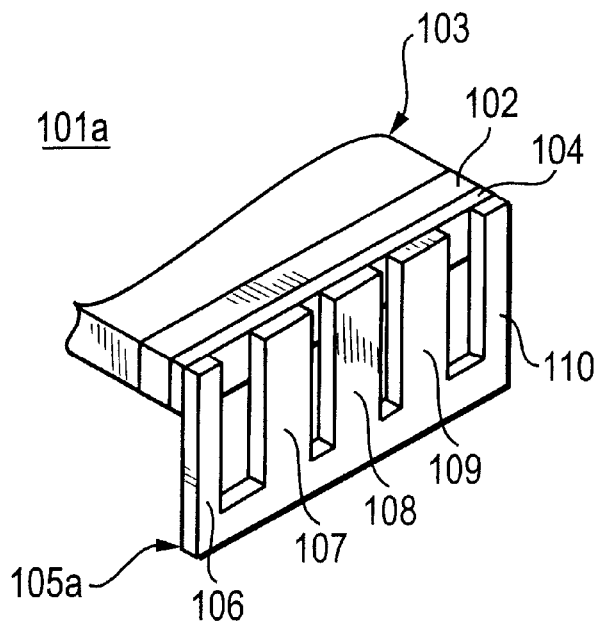
FIG. 20 is a perspective view of a monolithic ceramic capacitor 101a according to a twelfth embodiment of the present invention.
Figure 21:
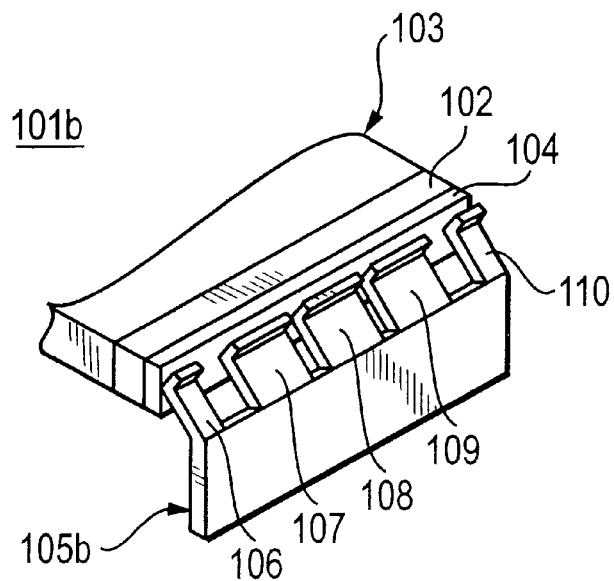
FIG. 21 is a perspective view partially showing a monolithic ceramic capacitor 101b according to a thirteenth embodiment of the present invention.

FIGS. 20 and 21 are perspective views partially illustrating monolithic ceramic capacitors 101a and 101b according to twelfth and thirteenth embodiments of the present invention, respectively. Elements in FIGS. 20 and 21 equivalent to elements shown in FIG. 16 are designated by similar reference numerals. Duplicated description is omitted.

In each terminal member 105 of FIG. 16, the plural terminal elements 106 through 110 are independent of each other. In the terminal members 105a and 105b as shown in FIGS. 20 and 21, respectively, the plural terminal elements 106 through 110 are formed in a comb-teeth shape.

Further, in the terminal member 105b of FIG. 21, the terminal elements 106 through 110 each have a bending shape to form a line-shaped or point-shaped bonding portion on the external electrode 102.

Figure 22:
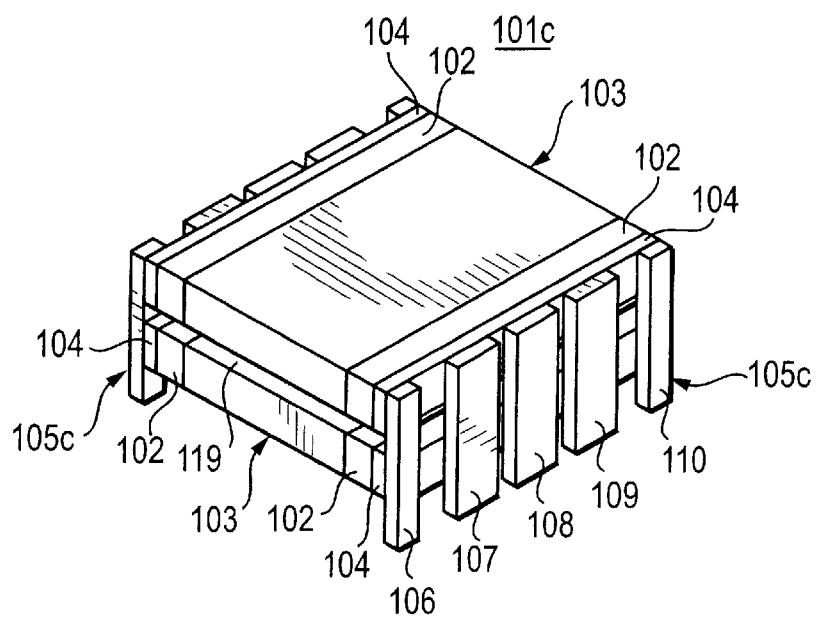
FIG. 22 is a perspective view of a monolithic ceramic capacitor 101c according to a fourteenth embodiment of the present invention.
Figure 23:
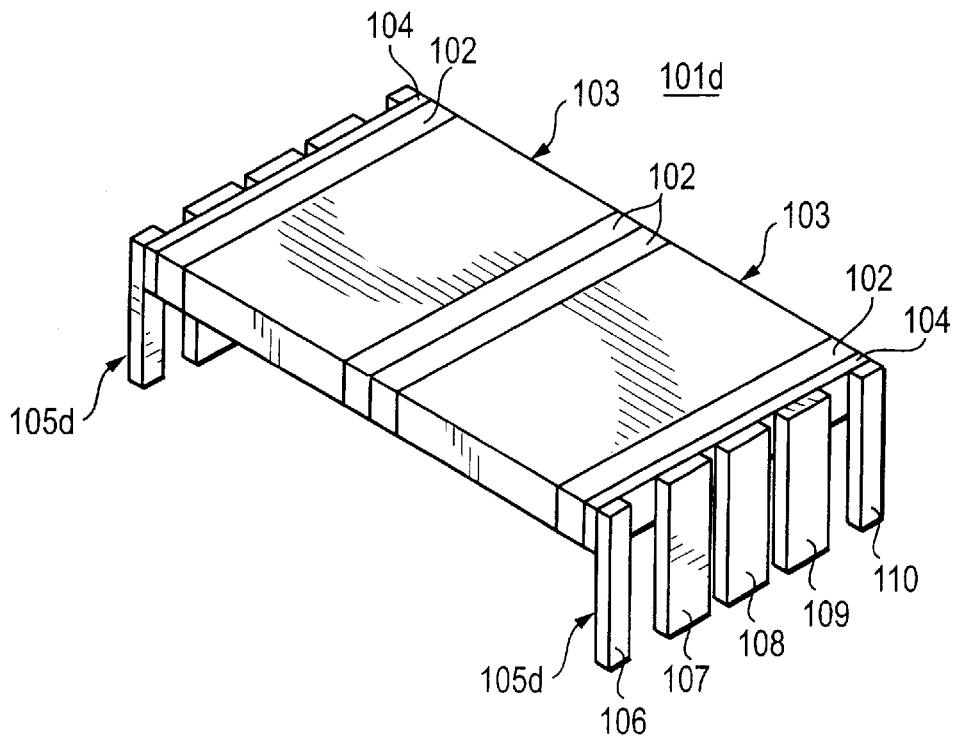
FIG. 23 is a perspective view of a monolithic ceramic capacitor 101d according to a fifteenth embodiment of the present invention.
Figure 24:
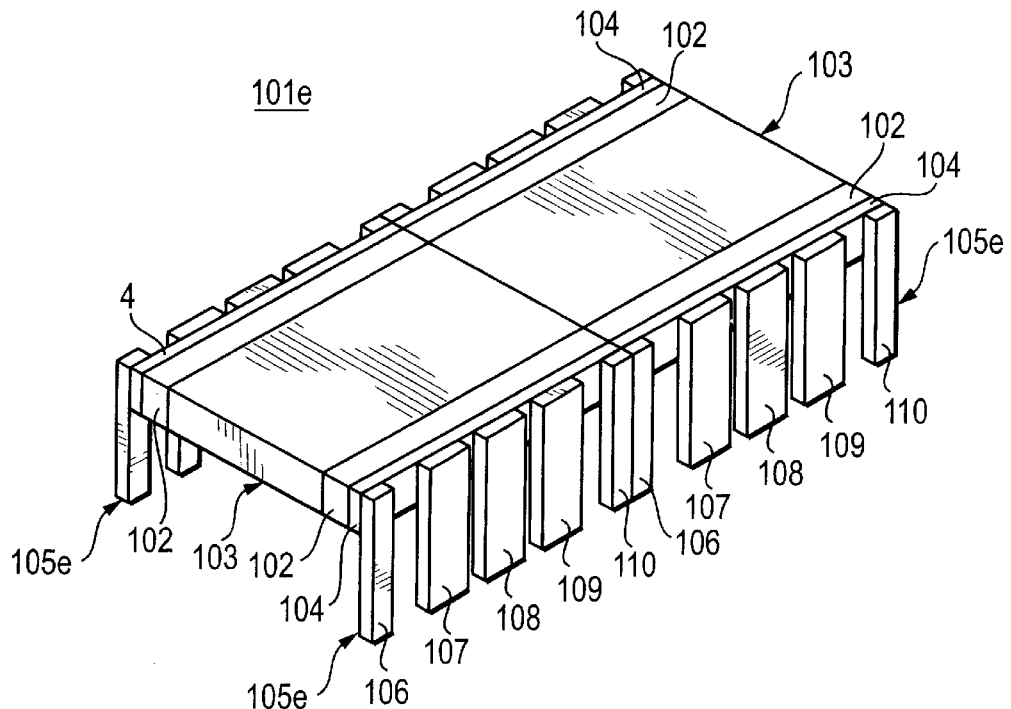
FIG. 24 is a perspective view of a monolithic ceramic capacitor 101e according to a sixteenth embodiment of the present invention.

FIGS. 22, 23, and 24 are perspective views showing monolithic ceramic capacitors 101c, 101d, and 101e according to a fourteenth, a fifteenth, and a sixteenth embodiment of the present invention, respectively. Elements in FIGS. 22 through 24 equivalent to those in FIG. 16 are designated by similar reference numerals. Duplicated description is omitted.

The monolithic ceramic capacitor 101c as shown in FIG. 22 has a stack component shape in which plural, e.g., two capacitor bodies 103 are stacked and attached together by a terminal member 105c comprising plural terminal elements 106 through 110 which is attached to the respective external electrodes 102 of the two capacitor bodies 103 in common. With the terminal members 105c, the two capacitor bodies 103 are electrically connected in parallel.

A gap 119 is provided between the two capacitor bodies 103 to prevent the electrostriction phenomena occurring in the respective capacitor bodies 103 from interfering with each other. The two capacitor bodies 103 may alternatively be bonded to each other through an adhesive with a Shore A hardness of up to 90 instead of the gap 119.

The monolithic ceramic capacitor 101d as shown in FIG. 23 is provided with plural, e.g., two capacitor bodies 103. These capacitor bodies 103 are arranged in series so as to lie in a plane. The external electrodes 102 to be connected of the two capacitor bodies 103 are bonded to each other through a conductive bonding material such as solder, a conductive adhesive, or the like. An appropriate terminal member, though not illustrated, may be inserted between the external electrodes 102 and bonded through the conductive bonding material, if necessarily.

Terminal members 105d composed of plural terminal elements 106 through 110 are attached to the external electrodes 102 positioned at the opposite ends of the two capacitor bodies 103 electrically connected in series as described above, respectively.

The monolithic ceramic capacitor 101e as shown in FIG. 24 is provided with plural, e.g., two capacitor bodies 103. These capacitor bodies 103 are arranged in an array component form in which the capacitor bodies 103 are arranged in parallel so as to lie in a plane and connected together. These two capacitor bodies 103 are bonded to each other by use of a two-side pressure-sensitive tape or an adhesive.

Terminal members 105e each composed of plural terminal elements 106 through 110 are attached to the external electrodes 102 of the two capacitor bodies 103, respectively.

Figure 25:
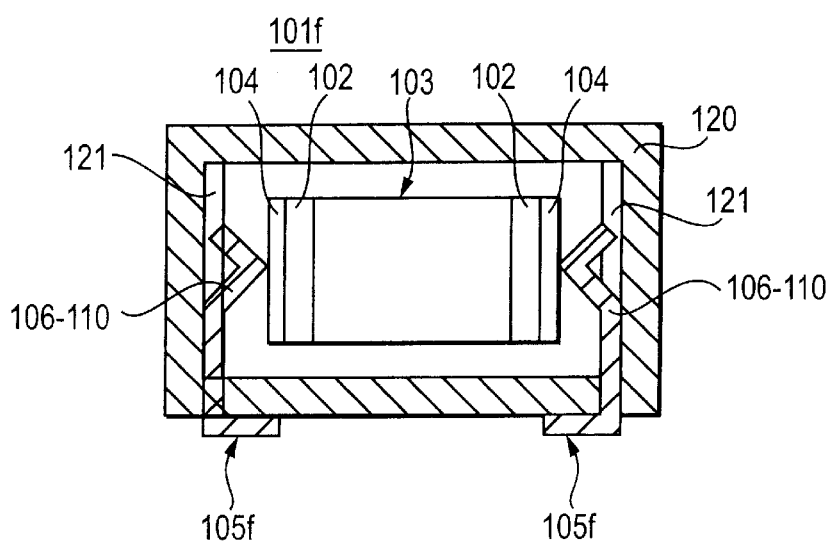
FIG. 25 is a partially sectional front view of a monolithic ceramic capacitor 101f according to a seventeenth embodiment of the present invention.

FIG. 25 is a sectional, front partial view showing a monolithic ceramic capacitor 101f according to a seventeenth embodiment of the present invention. Elements in FIG. 25 equivalent to those in FIG. 16 are designated by similar reference numerals. Duplicated description is omitted.

Figure 26:
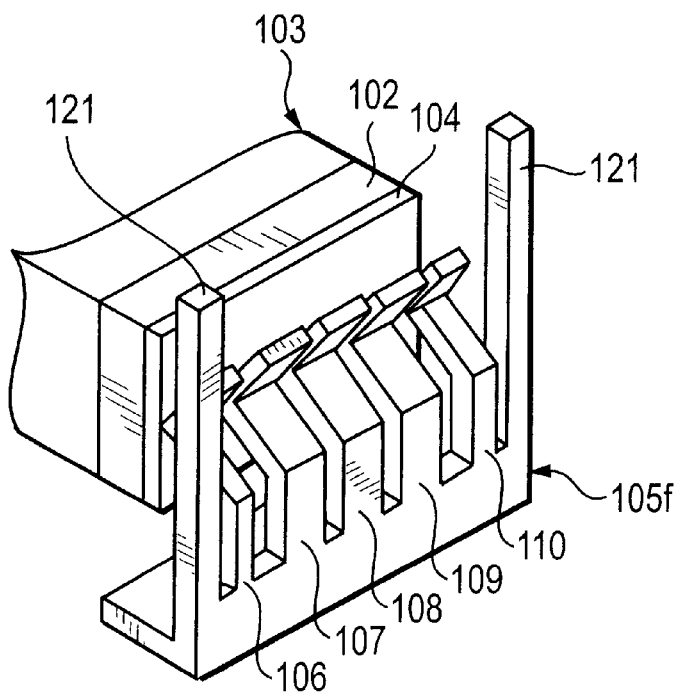
FIG. 26 is a perspective view partially showing the capacitor body 103 and the terminal member 105f provided for the monolithic ceramic capacitor 101f of FIG. 25.

Characteristically, the monolithic ceramic capacitor 101f as shown in FIG. 25 is provided with a case 120 for accommodating a capacitor body 103 while terminal members 105f are partially exposed outside. The perspective view of FIG. 26, is only a partial view of the components accommodated in the case 120 of the monolithic ceramic capacitor 101f.

In each terminal member 105f, plural terminal elements 106 through 110 are formed in a comb-teeth shape similarly to the terminal member 105b as shown in FIG. 21, and moreover, the terminal elements 106 through 110 are bent, respectively.

Further, positioning pieces 121 are integrally provided for each terminal member 105f at both sides thereof. The positioning pieces 121 are provided to position the capacitor body 103 in the case 120, as seen most clearly in FIG. 25.

In this embodiment, the capacitor body 103 is covered with the case 120. The transmission of impact during mounting to the capacitor body 103 can be reduced, and moreover, breaking of the capacitor body 103 caused by collision with external objects can be prevented. In addition, the case 120 can prevent an undesired stress applied to the terminal member 105f from being propagated to the bonding portion formed with solder 104.

Further, in this embodiment, though not illustrated, the space inside the case 120 may be packed with an appropriate resin (potting resin). By this way, the inside of the case 120 is shielded from moisture, gases, and so forth, and further improvements in reliability are realizable. When high voltage or high frequency current is applied to the monolithic ceramic capacitor 101f, heat is generated due to the impedance of the capacitor body 103. However, when a resin having a high thermal conductivity is employed as a potting resin, the heat radiating efficiency can be enhanced, as compared with the instance where the space remains in the case 120.

Heretofore, the present invention has been described in relation to the several illustrated embodiments. Further, various modifications and variations are possible without departing from the scope of the present invention.

For example, in the above-described embodiments, as the conductive bonding material for bonding the terminal members 105 or the like to the external electrodes 102, the solder 104 is used. However, conductive adhesive may be employed.

Further, in the illustrated embodiments, the solder 104 is coated all over the surface of the external electrodes 102. However, the solder 104 may be applied only to the portion required for the bonding to the terminal members 105 or the like.

In addition, an embodiment is possible in which the respective features of the above-described embodiments are combined. For example, the construction in which the case 120 as shown in FIG. 25 is provided may be employed in the respective embodiments as shown in FIGS. 16, and 20 through 24. Moreover, in the embodiments each containing the plural capacitor bodies 103 as shown in FIGS. 22 through 24, the shapes of a terminal member as shown in FIGS. 19, 20, and 21, respectively may be employed.

In the respective embodiments described above, in order that the size in the width direction of the respective terminal elements 106 and 110 is adjusted to be smaller than that of the respective terminal elements 107 through 109, the overall size in the width direction of the respective terminal elements 106 and 110 is decreased. Instead of this, in a respective part of each of the terminal elements 106 and 110, and more concretely, only in the respective parts thereof bonded to the external electrode 102, a notch or the like may be provided to reduce the size in the width direction.

In the above-described respective embodiments, as to the bonding areas of the plural terminal elements 106 through 110 bonded to the external electrode 102, effects of a stress caused by the electrostriction are reduced by making the bonding areas of the terminal elements at the ends in the width direction of the external electrode 102 smaller than those of the terminal elements in the center.

Figure 27:
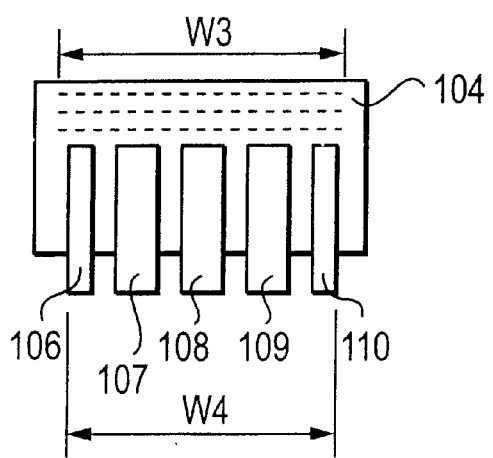
FIG. 27 is a side view of a monolithic ceramic capacitor according to an eighteenth embodiment of the present invention.

In the embodiment shown in FIG. 27, when the width W3 of an internal electrode is wider than the width W4 of the terminal member, damage to the ceramic, caused by electrostriction, can be more inhibited, since the ceramic is not affected by the gap portion between the internal electrode and an outer layer which is a non-vibrating portion.

Instead of reducing the sizes of the bonding areas, it is also possible to make the thickness of the terminal elements positioned at the ends in the arrangement direction thinner than that of the terminal elements positioned in the center so that the degree of constraining a stress caused by the electrostriction is reduced.

As described above, according to the present invention, terminal members each bonded to an external electrode of a capacitor body through a conductive bonding material are provided with a protrusion projecting toward the external electrode, and thereby, the bonding portion of the terminal member bonded to the external electrode, formed with the conductive bonding material is elongated substantially linearly on a part of the external electrode. Accordingly, electrostriction phenomena in the capacitor body are scarcely constrained, so that a stress caused by the electrostriction can be relaxed. Accordingly, breaking of the bonding portion and cracking of the capacitor body, and so forth, caused by such a stress, can be advantageously prevented. In addition, "creaking" can be considerably reduced.

In a capacitor body having plural internal electrodes formed in lamination therein, electrostriction in a thickness mode, that is, in the perpendicular to the internal electrodes is generated most readily. Accordingly, when the direction in which the bonding portion is elongated substantially linearly is substantially in parallel to the direction in which the internal electrodes are extended, vibration caused by electrostriction is scarcely constrained by the bonding portion of the terminal member, but is effectively emitted through the free ends of the capacitor body. Thus, the relaxation of a stress caused by electrostriction can be achieved more effectively.

Moreover, when the width of the bonding portion is selected to be preferably up to $2/3$, more preferably up to $4/9$, and most preferably up to $1/3$ of the size of the end face of the capacitor body, the size being measured in the lamination direction of the internal electrodes, the effect on the relaxation of a stress generated by electrostriction as described above can be achieved more securely.

Further, when the center in the width direction of the bonding portion is positioned in the range of $1/5$ to $4/5$, more preferably $2/8$ to $6/8$, and still more preferably $3/8$ to $5/8$ of the size of the end face from one side edge of the end face of the capacitor body in the lamination direction of the internal electrodes, the size being measured in the lamination direction of the internal electrodes, the effect on the relaxation of a stress generated by the electrostriction can be achieved more reliably as in the above instance.

According to the present invention, when the structure is employed in which plural capacitor bodies are provided, and terminal members are attached to the respective external electrodes of the capacitor bodies in common, the terminal members can function as a conductive member for connecting the plural capacitor bodies in parallel, for example. Accordingly, for example, a stack component can be simply obtained.

Furthermore, in the present invention, when the structure with the case for accommodating a capacitor body is employed, an impact produced during mounting is hardly transmitted to the capacitor body, and breaking of the capacitor body caused by collisions with external objects can be prevented. In addition, an undesired stress applied to a terminal member can be prevented from being propagated to the bonding portion.

When the case is provided as described above, and the positioning piece for positioning a capacitor body in the case is formed integrally with a terminal member, the capacitor body can be easily positioned without addition of a special piece for positioning, assembly of the monolithic ceramic capacitor can be simply carried out, and breaking of the monolithic ceramic capacitor in the mounting state can be advantageously prevented.

As described above, according to the present invention, a terminal member is provided with plural terminal elements arranged so as to be distributed at intervals in the width direction of an external electrode. The plural terminal elements, are constructed so that as to set the degree of constraining a stress produced by the electrostriction phenomenon in a capacitor body, which is attributed to the bonding of the terminal elements to the external electrode. More specifically, each terminal element positioned at the ends in the arrangement direction has a lower constraining-degree than each terminal element positioned in the center. Accordingly, on the portions where the terminal members are bonded to the external electrodes, on the capacitor body, and so forth, effects of a stress caused by electrostriction can be reduced. As a result, breaking of the bonding portions and cracking in the capacitor body, and so forth can be advantageously prevented.

According to the present invention, the desired degree of constraint can be simply realized, by setting the plural terminal elements at the ends in the width direction of the external electrode so as to have a smaller bonding area on the external electrode, as compared with the bonding area in the center.

In particular, the degree of constraining a stress as described above can be desirably realized by a simpler method by setting the plural terminal elements so that the size in the width direction of each terminal element positioned at the ends in the arrangement direction is smaller than each terminal element positioned in the center, and/or by setting the plural terminal elements so that the intervals between the terminal elements positioned at the ends in the arrangement direction and the next terminal elements are longer than those between the terminal element positioned in the center and the next terminal elements.

According to the present invention, the plural terminal elements may have the form that they are independent of each other or the terminal members each may have the plural terminal elements formed in a comb-teeth shape. These plural terminal elements can be simply obtained by changing suitably the cutting position of a material, for example, a hoop material, prepared for production of the terminal members.

When the structure is employed in which the capacitor body is accommodated in the case according to the present invention, impact during mounting is hardly transmitted to the capacitor body, breaking of the capacitor body caused by collision with external objects can be prevented, and moreover, an undesired stress applied to a terminal member can be prevented from being propagated to the bonding portions of the terminal member bonded to the external electrode.

In the instance that the case is provided as described above, by forming a positioning piece for positioning the capacitor body in the case integrally with the terminal member, the capacitor body can be easily positioned without addition of a special piece for positioning, assembly of the monolithic ceramic capacitor can be easily carried out, and breaking of the monolithic ceramic capacitor in the mounting state can be advantageously prevented.

Although the present invention has been described in relation to particular embodiments thereof, many other variations and modifications and other uses will become apparent to those skilled in the art. Therefore, the present invention is not limited by the specific disclosure herein.

What is claimed is:

1. A monolithic ceramic capacitor comprising a chip capacitor body having external electrodes formed on the opposite end faces thereof, and plural internal electrodes formed in lamination and each being electrically connected to a predetermined one of said external electrodes, respectively, and terminal members each formed of a metal plate bonded to said external electrodes with a conductive bonding material, each terminal member having a single substantially linear portion projecting towards and contacting a part of the external electrode so as to define a bonding portion where said terminal member is bonded to said external electrode with said conductive bonding material, said bonding portion being elongated substantially linearly on said part of said external electrode.

2. A monolithic ceramic capacitor according to claim 1, wherein said bonding portion is elongated substantially linearly in parallel with said internal electrodes.

3. A monolithic ceramic capacitor according to claim 2, wherein the width of said bonding portion is up to $2/3$ of the size of said end face, said size being measured in the lamination direction of said internal electrodes.

4. A monolithic ceramic capacitor according to claim 2, wherein the width of said bonding portion is up to $1/2$ of the size of said end face, said size being measured in the lamination direction of said internal electrodes.

5. A monolithic ceramic capacitor according to claim 2, wherein the width of said bonding portion is up to $1/3$ of the size of said end face, said size being measured in the lamination direction of said internal electrodes.

6. A monolithic ceramic capacitor according to claim 1, wherein said substantially linear portion is formed so as to be elongated continuously.

7. A monolithic ceramic capacitor according to claim 6, wherein said substantially linear portion is formed by a bending line of the metal plate constituting said terminal member.

8. A monolithic ceramic capacitor comprising a chip capacitor body having external electrodes formed on the opposite end faces thereof, and plural internal electrodes formed in lamination and each being electrically connected to a predetermined one of said external electrodes, respectively, and terminal members each formed of a metal plate bonded to said external electrodes with a conductive bonding material, each terminal member having a substantially linear edge projecting towards and contacting the external electrode, so that the bonding portion, where said terminal member is bonded to said external electrode with said conductive bonding material, is elongated substantially linearly on a part of said external electrode, wherein said bonding portion is elongated substantially linearly in parallel with said internal electrodes, and wherein the center in the width direction of said bonding portion lies in the range of $1/5$ to $4/5$ of the size of the end face distant from one side edge of said end face in the lamination direction of said internal electrodes, said size being measured in the lamination direction of said internal electrodes.

9. A monolithic ceramic capacitor according to claim 8, wherein the width of said bonding portion is up to ⅔ of the size of said end face, said size being measured in the lamination direction of said internal electrodes.

10. A monolithic ceramic capacitor according to claim 8, wherein the width of said bonding portion is up to 4/9 of the size of said end face, said size being measured in the lamination direction of said internal electrodes.

11. A monolithic ceramic capacitor according to claim 8, wherein the width of said bonding portion is up to ⅓ of the size of said end face, said size being measured in the lamination direction of said internal electrodes.

12. A monolithic ceramic capacitor comprising a chip capacitor body having external electrodes formed on the opposite end faces thereof, and plural internal electrodes formed in lamination and each being electrically connected to a predetermined one of said external electrodes, respectively, and terminal members each formed of a metal plate bonded to said external electrodes with a conductive bonding material, each terminal member having a substantially linear edge projecting towards and contacting the external electrode, so that the bonding portion, where said terminal member is bonded to said external electrode with said conductive bonding material, is elongated substantially linearly on a part of said external electrode, wherein said bonding portion is elongated substantially linearly in parallel with said internal electrodes, and wherein the center in the width direction of said bonding portion lies in the range of ¼ to ¾ of the size of the end face distant from one side edge of said end face in the lamination direction of said internal electrodes, said size being measured in the lamination direction of said internal electrodes.

13. A monolithic ceramic capacitor according to claim 12, wherein the width of said bonding portion is up to ⅔ of the size of said end face, said size being measured in the lamination direction of said internal electrodes.

14. A monolithic ceramic capacitor according to claim 12, wherein the width of said bonding portion is up to 4/9 of the size of said end face, said size being measured in the lamination direction of said internal electrodes.

15. A monolithic ceramic capacitor according to claim 12, wherein the width of said bonding portion is up to ⅓ of the size of said end face, said size being measured in the lamination direction of said internal electrodes.

16. A monolithic ceramic capacitor comprising a chip capacitor body having external electrodes formed on the opposite end faces thereof, and plural internal electrodes formed in lamination and each being electrically connected to a predetermined one of said external electrodes, respectively, and terminal members each formed of a metal plate bonded to said external electrodes with a conductive bonding material, each terminal member having a substantially linear edge projecting towards and contacting the external electrode, so that the bonding portion, where said terminal member is bonded to said external electrode with said conductive bonding material, is elongated substantially linearly on a part of said external electrode, wherein said bonding portion is elongated substantially linearly in parallel with said internal electrodes, and wherein the center in the width direction of said bonding portion lies in the range of ⅜ to ⅝ of the size of the end face distant from one side edge of said end face in the lamination direction of said internal electrodes, said size being measured in the lamination direction of said internal electrodes.

17. A monolithic ceramic capacitor according to claim 16, wherein the width of said bonding portion is up to ⅔ of the size of said end face, said size being measured in the lamination direction of said internal electrodes.

18. A monolithic ceramic capacitor according to claim 16, wherein the width of said bonding portion is up to 4/9 of the size of said end face, said size being measured in the lamination direction of said internal electrodes.

19. A monolithic ceramic capacitor according to claim 9, wherein the width of said bonding portion is up to ⅓ of the size of said end face, said size being measured in the lamination direction of said internal electrodes.

* * * * *